United States Patent
Fishkin et al.

(10) Patent No.: US 6,276,371 B1
(45) Date of Patent: Aug. 21, 2001

(54) METHOD AND APPARATUS FOR CLEANING THE EDGE OF A THIN DISC

(75) Inventors: Boris Fishkin, San Carlos; Brian J. Brown, Palo Alto; Jianshe Tang, Cupertino, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/589,463

(22) Filed: Jun. 7, 2000

Related U.S. Application Data

(62) Division of application No. 09/191,057, filed on Nov. 11, 1998, now Pat. No. 6,119,708.

(51) Int. Cl.[7] ........................................ B08B 3/12

(52) U.S. Cl. ........................................ 134/1.3; 134/33

(58) Field of Search .................. 134/902, 1.3, 140, 134/147, 184, 33

(56) References Cited

U.S. PATENT DOCUMENTS

| | | | |
|---|---|---|---|
| 4,869,278 | * | 9/1989 | Bran ........................... 134/184 |
| 5,090,432 | * | 2/1992 | Bran ........................... 134/184 X |
| 5,379,785 | * | 1/1995 | Ohmori et al. ............... 134/184 |
| 5,383,484 | * | 1/1995 | Thomas et al. ............... 134/184 |
| 5,672,212 | * | 9/1997 | Manos .......................... 134/1.3 |

FOREIGN PATENT DOCUMENTS

| | | | |
|---|---|---|---|
| 0860860 A2 | * | 8/1998 | (EP) . |
| 04049619 | * | 2/1992 | (JP) . |
| 09075874 | * | 3/1997 | (JP) . |

OTHER PUBLICATIONS

STEAG Electronic Systems CMP—"STEAG announces the Trident 300 Post–CMP Cleaner".

* cited by examiner

*Primary Examiner*—Philip R. Coe
(74) *Attorney, Agent, or Firm*—Dugan & Dugan

(57) ABSTRACT

A method and apparatus for cleaning wafer edges is provided. The inventive wafer cleaner employs a transducer equal in length to the diameter of a wafer to be cleaned, and positioned to direct sonic energy in line with the wafer's edge. Supporting and rotating mechanisms are positioned along the wafer's edge, outside of the transducer's high energy field, and preferably such that approximately 50 percent of the wafer is positioned between the wafer supports and the transducer. Therefore, minimal sonic energy is blocked from reaching the wafer's surface. The transducer dimensions relative to the wafer, and the positioning of the wafer supports relative to the transducer enable the system to achieve an approximately 50 percent edge cleaning duty cycle as the wafer is rotated.

10 Claims, 5 Drawing Sheets

METHOD AND APPARATUS FOR CLEANING THE EDGE OF A THIN DISC

This application is a divisional of U.S. patent application Ser. No. 09/191,057, filed Nov. 11, 1998, and now U.S. Pat. No. 6,119,708.

FIELD OF THE INVENTION

The present invention relates generally to apparatuses and methods for cleaning thin discs, such as semiconductor wafers, compact discs, glass wafers and the like. More particularly, the invention relates to effective cleaning of thin disc edges.

BACKGROUND OF THE INVENTION

To manufacture a thin disc such as a semiconductor wafer, an elongated billet of semiconductor material is cut into very thin slices, about ¾ mm in thickness. The slices or wafers of semiconductor material are then lapped and polished by a process that applies an abrasive slurry to the semiconductor wafer's surfaces. A similar polishing step is performed to planarize dielectric or metal films during subsequent device processing on the semiconductor wafer.

After polishing, be it during wafer or device processing, slurry residue conventionally is cleaned from wafer surfaces via submersion in a tank of sonically energized cleaning fluid, via spraying with sonically energized cleaning or rinsing fluid, or via a scrubbing device which employs brushes made from bristles, or from a sponge-like material, etc. Although these conventional cleaning devices remove a substantial portion of the slurry residue which adheres to wafer edges, slurry particles nonetheless remain and produce defects during subsequent processing. Specifically, subsequent processing has been found to redistribute slurry residue from the wafer edges to the front of the wafer, causing defects.

A number of devices have been developed to improve wafer edge cleaning. Most of these devices are employed as a separate step following major surface cleaning or scrubbing. However, a few scrubbing devices have been developed that can simultaneously scrub both the major and edge surfaces of a wafer. One such device is shown in the side elevational view of FIG. 1. The scrubbing device 11 of FIG. 1 comprises a pair of PVA brushes 13a, 13b. Each brush comprises a plurality of raised nodules 15 across the surface thereof, and a plurality of valleys 17 located among the nodules 15. The scrubber 11 also comprises a platform 19 for supporting a wafer W and a mechanism (not shown) for rotating the pair of PVA brushes 13a, 13b. The platform 19 comprises a plurality of spinning mechanisms 19a–c for spinning the wafer W. During scrubbing a fluid supply mechanism F, such as a fluid source coupled to a plurality of spray nozzles, supplies fluid to both major surfaces of the wafer, flushing dislodged particles and cleaning residue from the major surface of the wafer and rinsing brushes 13a and 13b. Preferably, the pair of PVA brushes 13a, 13b are positioned to extend beyond the edge of the wafer W, so as to facilitate cleaning the wafer's edges. This mechanism further employs a separate edge brush 21, which is driven by a separate motor (not shown), that causes the edge brush 21 to rotate. The edge brush 21 fits over the edge of the wafer W as shown in FIG. 1, providing more effective wafer edge cleaning.

Although the edge brush 21 addresses the need to clean slurry residue from wafer edges, it does so at the expense of increased scrubber complexity and cost, and the requirement of frequent edge brush replacement because of excessive mechanical wear. Often, megasonic wafer cleaning within a submersion tank is preferred to scrubber type cleaning, such as when it is desirable to alter the chemistry of the cleaning solution as the PVA brushes commonly used for brush scrubbing have limited chemical compatibility (e.g., to make the wafer hydrophobic or hydrophilic). In these instances, the use of a conventional edge scrubber following megasonic cleaning significantly increases wafer cleaning time, reducing productivity, and thereby increasing the cost of each wafer unit processed.

Accordingly, the field of semiconductor wafer processing needs an improved megasonic cleaner that will simultaneously clean both the major surfaces and the edge surfaces of a wafer, and that will do so with minimal additional components so as to satisfy the ever present demand for reduced processing costs.

SUMMARY OF THE INVENTION

The present inventors have satisfied this need by repositioning and resizing conventional megasonic cleaning parts to achieve edge cleaning results previously unattainable within conventional megasonic cleaning tanks.

The present invention achieves superior edge cleaning by providing a transducer preferably equal in length to the diameter of the wafer to be cleaned. The transducer is positioned within a tank of cleaning fluid at a 180° angle from (i.e., in line with) the outer edge of a wafer supported in the tank. The wafer is supported in a rotatable manner, and is rotated during cleaning such that each portion of the wafer surface is contacted by equal amounts of sonic energy during each revolution of the wafer.

Unlike the wafer supports of conventional megasonic cleaning tanks that rotate a wafer during cleaning (described in detail with reference to FIGS. 2 and 3), the wafer supports of the present invention are positioned outside the region of the wafer which is closest to the transducer (i.e., outside the transducer's high energy field). The wafer supports of the present invention are positioned such that approximately 25 to 50 percent of the wafer is located between the wafer supports and the transducer. Positioning 50 percent of the wafer between the wafer supports and the transducer is most preferred. However, when the present invention is configured for a vertical wafer orientation, the wafer supports are preferably positioned such that slightly less than 50 percent of the wafer is positioned between the wafer supports and the transducer to prevent the wafer from slipping through the wafer supports, and to ease tolerancing requirements.

A wafer stabilizing mechanism may be positioned along the wafer's edge to prevent wafer wobble. In order to allow the wafer to be easily lifted and lowered to and from the tank, the stabilizing mechanism is preferably positioned along the wafer's lower portion, and is as small as possible to provide stabilization while blocking minimal amounts of sonic energy from reaching the wafer. Although the stabilizing mechanism may be positioned within the transducer's high energy field, the stabilizing mechanism is offset slightly from the nadir of the wafer, and thus does not block the wafer's center from obtaining a direct line of megasonic energy during rotation.

Because the transducer preferably extends a length equal to the diameter of the wafer, and because any obstruction between the transducer and the wafer is minimal, approximately 50 percent of the wafer's edge is continually cleaned and approximately 100 percent of the transducer's energy is used for cleaning. The present invention therefore provides nearly a 50 percent edge cleaning duty cycle, and exhibits superior edge cleaning as compared to conventional systems.

Other objects, features and advantages of the present invention will become more fully apparent from the following detailed description of the preferred embodiments, the appended claims and the accompanying drawings.

DETAILED DESCRIPTION OF THE PREFERRED EMBODIMENT

Conventional megasonic tank cleaners employ a fluid filled tank having wafer supports therein and a source of megasonic energy, (e.g., a transducer) coupled to the fluid for directing sonic energy through the fluid to the face of a wafer supported therein. Often the transducer is positioned along the bottom of the tank and directs sonic energy upward to the wafer. During megasonic cleaning, an alternating voltage is applied to the transducer resulting in transducer oscillation between compression and expansion at approximately 1 MHz frequency thereby coupling megasonic energy to the fluid. As the energy imparted to the fluid oscillates between positive and negative displacement, cavitation or bubbles form in the liquid during expansion and collapse or shrink during compression. This bubble cavitation gently cleans the surface of the wafer.

In practice, megasonic cleaners experience a number of limitations. For instance, typically the larger a transducer is the more energy it requires to operate. Large transducers, therefore, generate considerable heat during operation. Cooling systems are often coupled to transducers to prevent melting of transducer adhesives or surrounding materials. Transducer cooling systems nonetheless, undesirably increase the cost of megasonic cleaning.

An alternative approach has been to employ smaller transducers. However, the energy emitted from a smaller transducer is unable to contact the entire surface of a wafer, requiring the wafer to be rotated or translated back and forth through the energy field. To eliminate the need for wafer translation through the energy field, transducers have been either formed with a convex energy emitting surface, or coupled to a convex lens for diverging the energy waves so that the energy waves may contact the entire surface of the wafer. A problem with such diverging systems is uneven cleaning across wafer surfaces, as power density decreases proportionally to 1/R, where R is the distance from the center of a cylindrical transducer.

Figure 2:
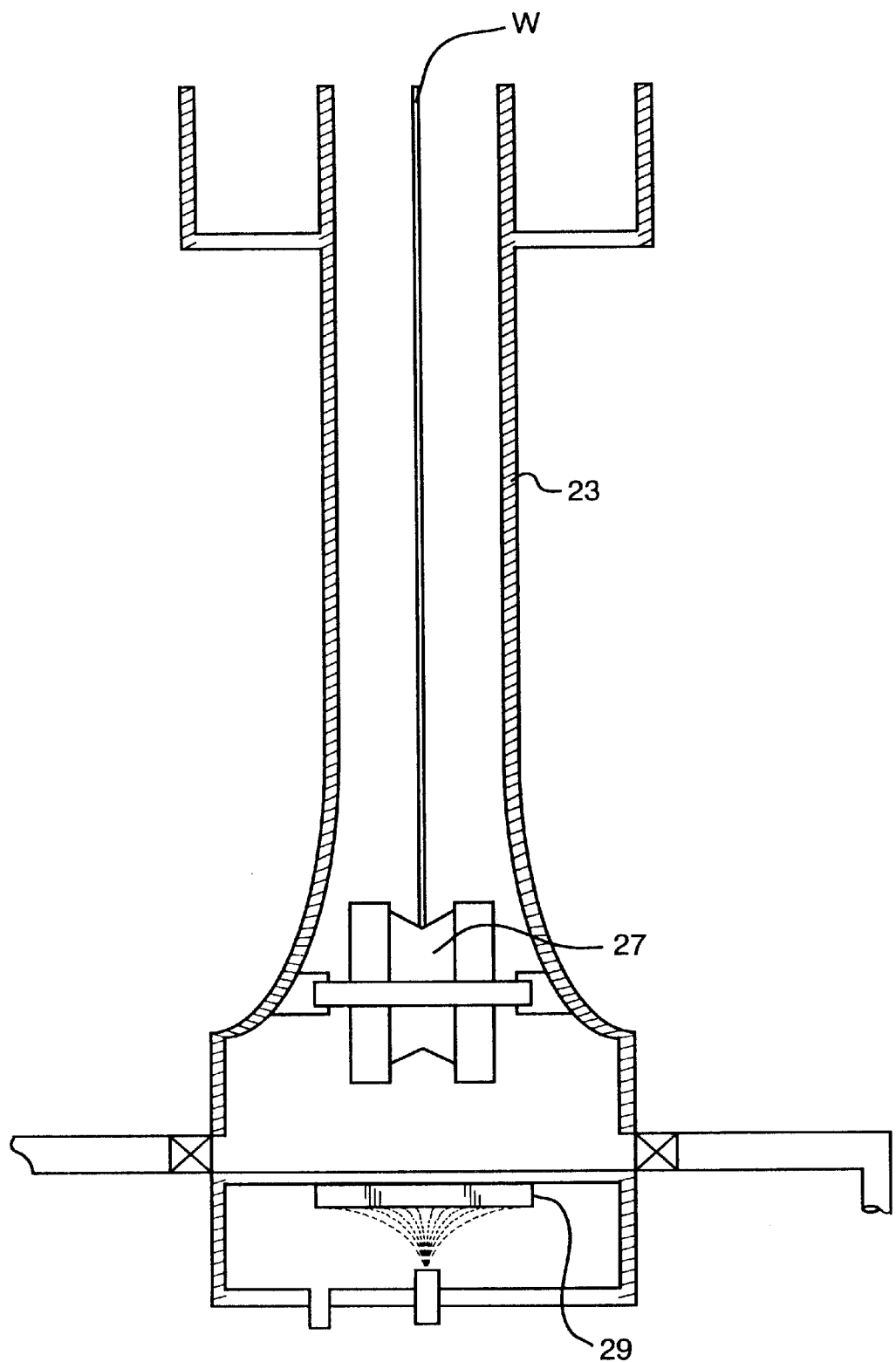
FIG. 2 is a side plan view of a conventional megasonic cleaner.
Figure 3:
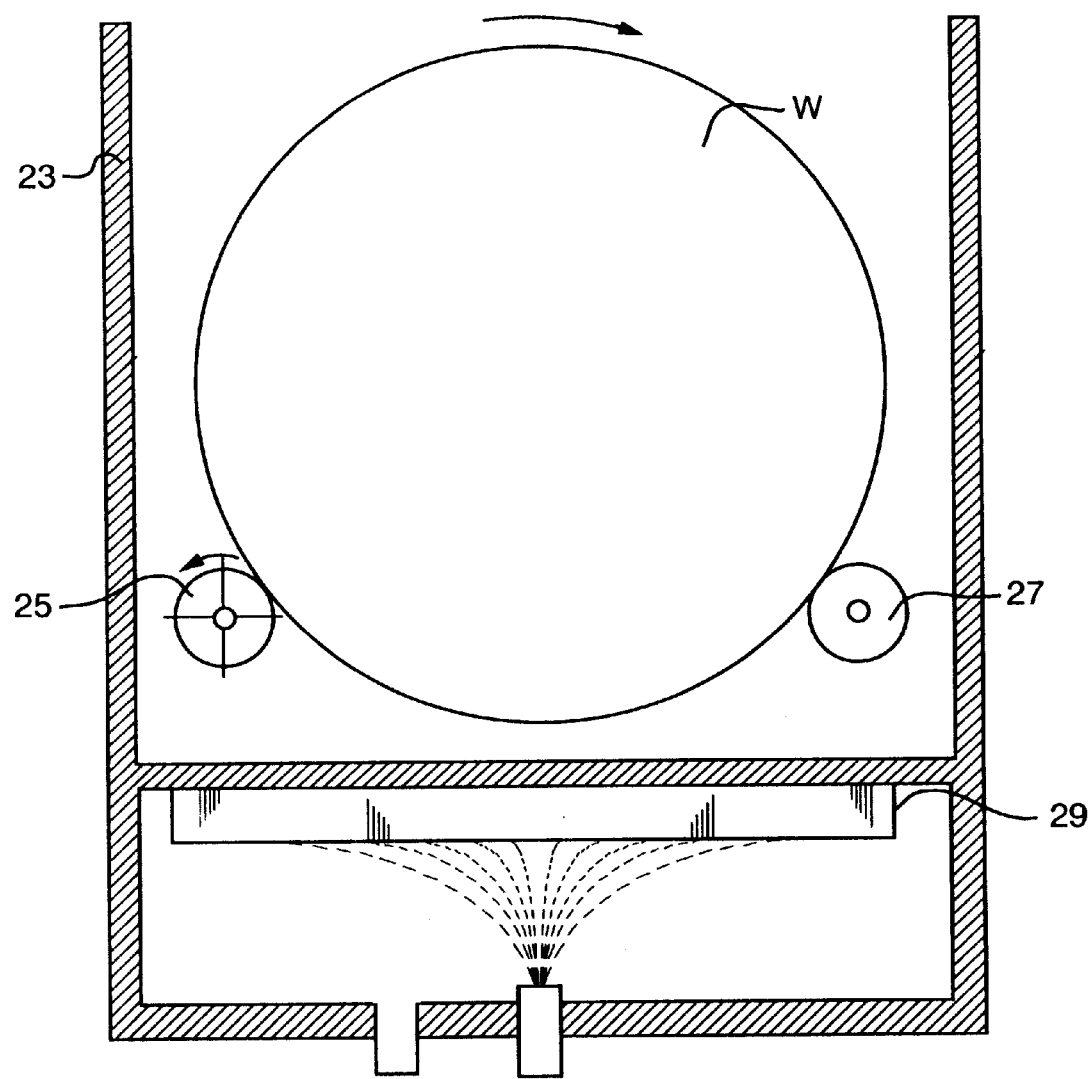
FIG. 3 is a front plan view of the conventional megasonic cleaner of FIG. 2.

To address the problem of uneven cleaning across the wafer's face, one conventional megasonic cleaning tank has employed wheels for rotating a wafer supported therein, as disclosed in U.S. Patent No. 5,090,432 (the '432 Patent). FIGS. 2 and 3, respectively show a side view and a front plan view of the '432 system's pertinent parts. The '432 system generally comprises a tank 23 for submerging a wafer W within a cleaning fluid contained therein. The wafer W is supported by an "impeller" 25, configured roughly like a paddle wheel, and by a roller 27. A transducer 29 is mounted to the bottom of the tank 23, and is dimensioned to extend the distance between the center of the impeller 25 and the center of the roller 27. Thus, sonic energy from the transducer 29 is directed vertically toward one half of the impeller 25, causing the impeller 25 to rotate therewith. As the impeller 25 rotates, so does the wafer W. Thus, each portion of the wafer W's face is impacted by equal amounts of sonic energy during each full revolution of wafer W. Thus, the system of the '432 patent solves the problem of uneven cleaning across the wafer's face. However, like other major surface cleaners, the '432 system does not sufficiently clean the wafer's edge.

Figure 1:
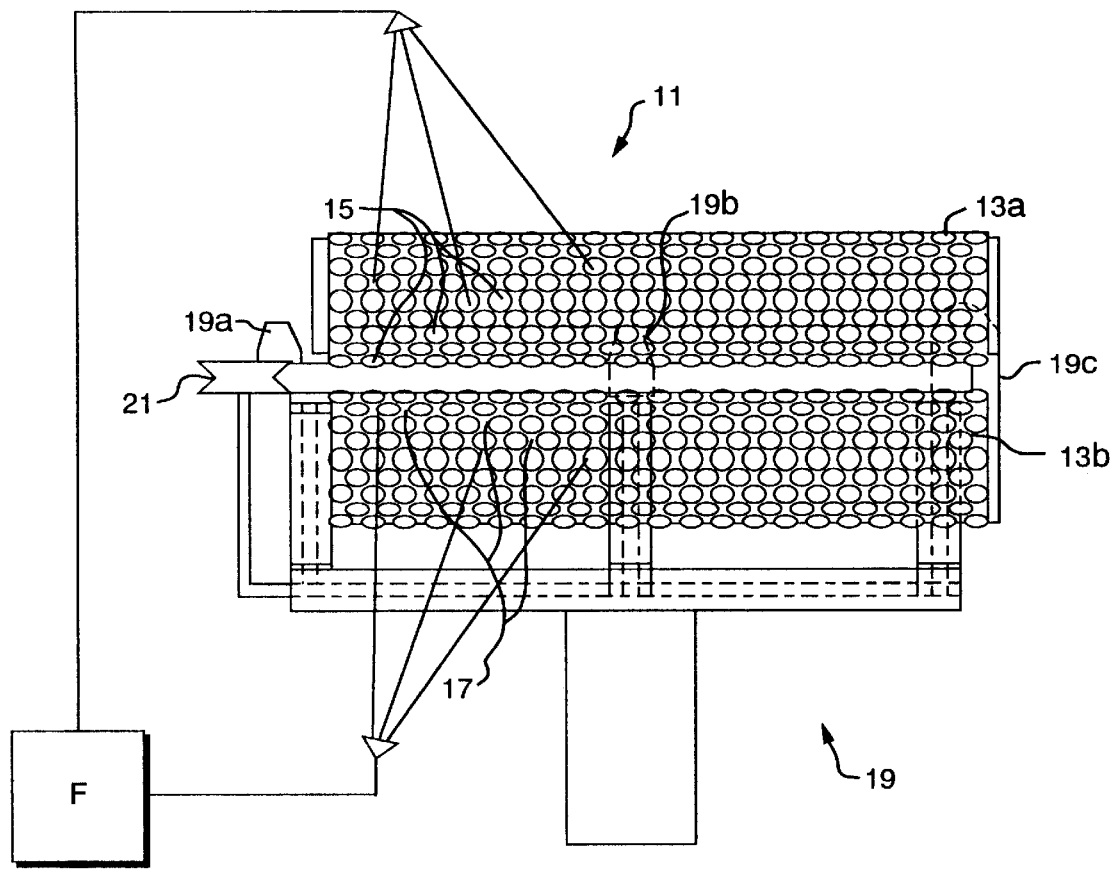
FIG. 1 is a schematic side elevational view of a conventional scrubber which employs an edge cleaning brush, as previously described.

Prior to the present invention, normal practice would involve transferring a wafer from the '432 system to a system designed particularly for edge cleaning, such as the system shown in FIG. 1. The inventors of the present system have eliminated the need for such subsequent processing, by designing a megasonic tank type cleaning system capable of achieving highly clean surfaces along both the wafer's face and edge surface. The inventive system requires no more parts than those already required by rotational megasonic cleaning tanks such as the '432 system.

Figure 4:
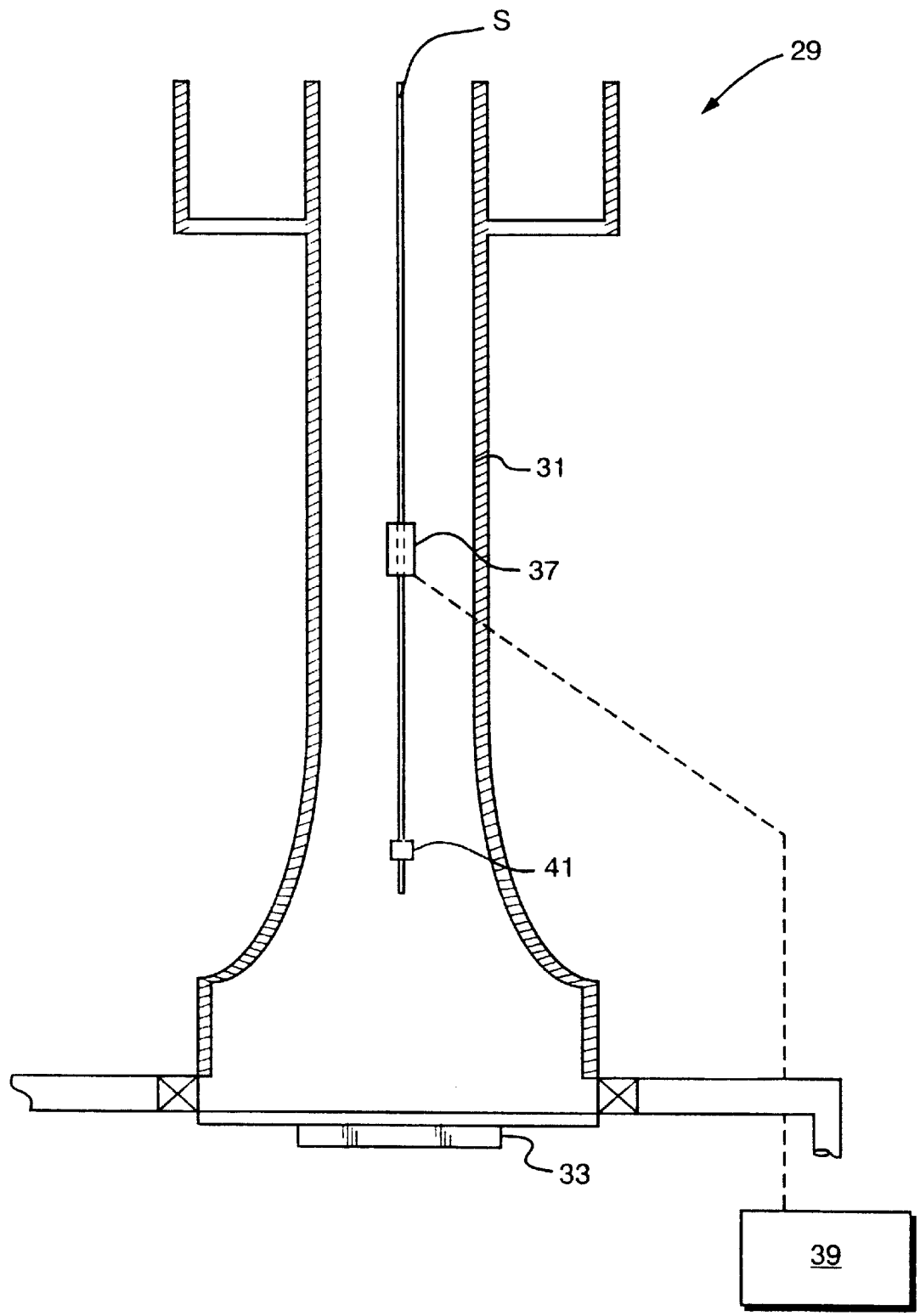
FIG. 4 is a side plan view of a preferred embodiment of the present invention.
Figure 5:
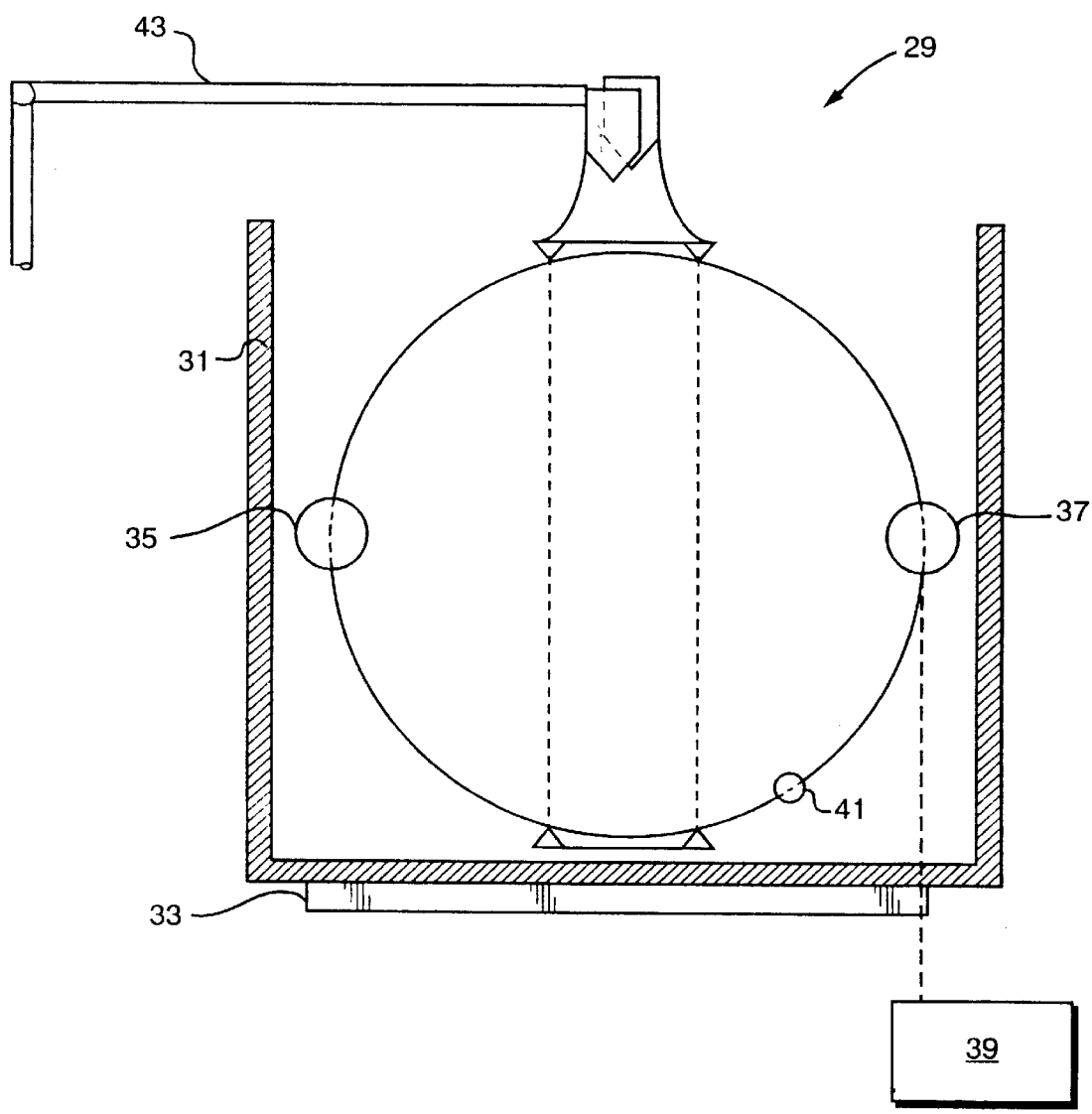
FIG. 5 is a front plan view of the embodiment of FIG. 4.

FIGS. 4 and 5 are a side plan view and a front plan view, respectively, of an inventive megasonic cleaning tank 29 for cleaning the edge surface of a substrate such as a semiconductor wafer. The megasonic cleaning tank 29 comprises a tank 31, having a transducer 33 positioned along the bottom thereof. The transducer 33 is preferably approximately equal in length to the diameter of the wafer to be cleaned.

Above the transducer 33 a first wafer support 35 and a second wafer support 37 are positioned to vertically support a wafer W in line with the transducer 33. The wafer supports 35 and 37 are rotatable, and each preferably comprises a rotatable wheel having a v-shaped groove for supporting a wafer with minimal contact.

In the example of FIGS. 4 and 5, the second wafer support 37 is operatively coupled to a motor 39 which causes the second wafer support 37 to rotate, that is the second wafer support 37 is actively rotatable. The first wafer support 35 may be actively rotatable or may rotate passively when contacted by the rotating wafer W. Thus, the actively rotatable second wafer support 37 acts as both a wafer support and as a rotating mechanism for causing the wafer W to rotate. Alternatively, both the wafer supports 35 and 37 may rotate passively when contacted by the rotating wafer W, and a separate mechanism may be coupled to the motor 39 and positioned as to contact and rotate a wafer positioned on the wafer supports 35 and 37 (i.e., operatively coupled to the wafer supports 35 and 37).

Unlike the rotatable wafer supports of the prior art, the wafer supports 35 and 37 are positioned so as to contact the wafer outside of the region closest to the transducer 33, that is, outside of the transducer 33's high energy field. Preferably the first and second wafer supports 35 and 37 are positioned along the edge of the wafer W so that approximately 40 to 50 percent of the wafer edge is located between the first wafer support 35, the second wafer support 37 and the transducer 33. Most preferably the first wafer support 35 and the second wafer support 37 are positioned such that approximately 44 percent of the wafer W is located between the first wafer support 35, the second wafer support 37 and the transducer 33. Such positioning ensures sufficient contact between the wafer and the wafer supports so that rotation of the wafer supports causes the wafer to rotate. Positioning 50% of the wafer between the first wafer support 35, the second wafer support 37 and the transducer 33 minimizes shadowing of the wafer surface by the wafer supports, but requires tighter tolerancing to maintain sufficient frictional contact between the wafer and the wafer supports to rotate the wafer.

Because the first wafer support 35 and the second wafer support 37 of FIGS. 4 and 5 support the wafer vertically, the first wafer support 35 and the second wafer support 37 are preferably positioned such that slightly less than 50 percent of the wafer W is between the first wafer support 35, the second wafer support 37 and the transducer 33. In this manner the size and relative positions of the first wafer support 35 and the second wafer support 37 can be less precisely toleranced and still prevent the wafer W from slipping therethrough.

A stabilizing mechanism 41 is positioned so as to contact and thereby stabilize the wafer W positioned on the first wafer support 35 and the second wafer support 37 (i.e., is operatively coupled to the first wafer support 35 and the second wafer support 37). The stabilizing mechanism is positioned outside of the point along the wafer's edge which is closest to the transducer 33, and is therefore outside of the transducer 33's highest energy field. The stabilizing mechanism may be positioned so as to contact the wafer W at any point that will sufficiently reduce or prevent the wafer W from wobbling.

For vertically oriented systems such as the system 29 of FIGS. 4 and 5, the stabilizing mechanism is preferably located along the lower half of the wafer's edge, as positioning the stabilizing mechanism along the upper half of the wafer's edge may require the stabilizing mechanism to be moved out of position during loading and unloading of wafer's to the tank 31.

An automated wafer handler such as a robot 43 (FIG. 5) is operatively coupled to the megasonic cleaning tank 29 so as to load and unload wafer's from the first wafer support 35 and the second wafer support 37. In operation, the robot 43 transfers a wafer W from a storage location or from a transport mechanism, etc., to the first wafer support 35 and the second wafer support 37.

In the example of FIGS. 4 and 5, the tank 31 contains sufficient fluid so as to submerge the entire wafer W. When the wafer W is in position on the first wafer support 35 and the second wafer support 37, the wafer W is in line with the transducer 33, and slightly less than 50 percent of the wafer W is located between the first wafer support 35, the second wafer support 37 and the transducer 33. Thus, slightly less than 50 percent of the wafer W's edge is contacted by sonic energy from the transducer 33 at any given time. It will be understood that positioning the stabilizing mechanism along the lower half of the wafer W, as shown in FIGS. 4 and 5, will further lessen the percentage of sonic energy which contacts the edge of the wafer W.

In operation the transducer 33 is energized and begins oscillating at a megasonic rate. Megasonic energy is therefore coupled to the fluid and travels upward therethrough to contact at least the edge surfaces of the wafer W. The motor 39 is energized and rotates the second wafer support 37 causing the wafer W to rotate. As the wafer W rotates, the first wafer support 35 passively rotates therewith, thus preventing unnecessary friction between the first wafer support 35 and the wafer W which could damage the wafer W. The stabilizing mechanism contacts the edge of the wafer W, reducing and preferably preventing wafer wobble.

As the wafer W rotates, nearly 50 percent of the wafer's edge surface is contacted by megasonic energy from the transducer 33 at any given time. Thus, any point along the edge surface of the wafer W experiences a 50 percent cleaning cycle with each revolution of the wafer W. The increased cleaning cycle makes the inventive megasonic cleaning tank 29 a much more effective edge cleaner than any prior art system of which the inventors are aware.

The inventive system described above also exhibits a 100 percent major surface cleaning cycle. Accordingly, the present invention simultaneously provides superior cleaning of a wafer's major and edge surfaces, without requiring additional system components or additional processing time. After the wafer W has completed a desired number of revolutions, the robot 43 transfers the wafer W to another cleaning station or a drier, and positions a new wafer onto the first wafer support 35 and the second wafer support 37.

The foregoing description discloses only the preferred embodiments of the invention, modifications of the above disclosed apparatus and method which fall within the scope of the invention will be readily apparent to those of ordinary skill in the art. For instance, the wafer need not be vertically oriented and accordingly the number and positioning of the wafer supports may vary to accommodate alternative wafer positions. The wafer supports may comprise mechanisms other than grooved wheels, for example, simple bar type rollers may be used, although additional stabilizing mechanisms may be required. The inventive cleaning method and apparatus can be used within any tank cleaning systems including those which employ additional features to facilitate major surface cleaning, and/or edge cleaning. As used herein, a substrate or a wafer includes, but is not limited to a semiconductor wafer with or without material layers thereon, whether patterned or unpatterned.

Accordingly, while the present invention has been disclosed in connection with the preferred embodiments thereof, it should be understood that other embodiments may fall within the spirit and scope of the invention, as defined by the following claims.

We claim:

1. A method of cleaning the edge of a wafer comprising:

positioning a sonic energy source along a flat bottom of a fluid container;

supporting a wafer in a vertical orientation by a pair of supports positioned along opposite sides of the wafer; and directing sonic energy from the sonic energy source in line with the wafer through the fluid to the edge of the wafer such that approximately 50 percent of the wafer's edge is contacted with sonic energy as the wafer rotates.

2. The method of claim 1 comprising contacting 50 percent of the wafer's edge with sonic energy as the wafer rotates.

3. The method of claim 1 wherein directing sonic energy in line with the wafer further comprises contacting between approximately 40 and 50 percent of the wafer's edge with sonic energy as the wafer rotates.

4. The method of claim 1 wherein directing sonic energy in line with the wafer further comprises contacting between 40 and 50 percent of the wafer's edge with sonic energy as the wafer rotates.

5. The method of claim 1 wherein directing sonic energy in line with the wafer further comprises contacting approximately 44 percent of the wafer's edge with sonic energy as the wafer rotates.

6. The method of claim 1 further comprising rotating the pair of wafer supports.

7. The method of claim 6 wherein rotating the pair of wafer supports comprises actively rotating at least one of the wafer supports via a motor.

8. The method of claim 7 further comprising stabilizing the wafer to reduce wafer wobble by placing the wafer's edge in contact with a stabilizing wheel at a location outside of the highest intensity field of sonic energy.

9. The method of claim 1 further comprising stabilizing the wafer to reduce wafer wobble.

10. The method of claim 9 wherein stabilizing the wafer comprises contacting the wafer's edge with a stabilizer at a location outside the highest intensity field of sonic energy.

* * * * *